(12) United States Patent
Shibata

(10) Patent No.: US 6,393,069 B1
(45) Date of Patent: May 21, 2002

(54) CIRCUIT AND METHOD FOR COMPENSATING FOR DEGRADATION IN PULSE WIDTH OF BURST DATA

(75) Inventor: Kohei Shibata, Kanagawa (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/098,229

(22) Filed: Jun. 16, 1998

(30) Foreign Application Priority Data

Feb. 17, 1998 (JP) .......................................... 10-034369

(51) Int. Cl.[7] .............................. H03D 1/00; H04L 27/00
(52) U.S. Cl. ............................. 375/340; 327/31; 327/37
(58) Field of Search ................................. 375/317, 342, 375/259, 325, 340, 254, 285, 346; 327/26, 31, 307, 309, 18, 180, 40, 37

(56) References Cited

U.S. PATENT DOCUMENTS

| | | | |
|---|---|---|---|
| 4,449,061 A | * | 5/1984 | Yasuda et al. |
| 5,281,810 A | | 1/1994 | Fooks et al. |
| 5,359,238 A | | 10/1994 | Lesko |
| 5,373,400 A | | 12/1994 | Kovacs |
| 5,498,993 A | | 3/1996 | Ohtsuka et al. |
| 6,163,580 A | * | 12/2000 | Jackson et al. .............. 375/317 |

FOREIGN PATENT DOCUMENTS

| | | | |
|---|---|---|---|
| JP | 09008739 | | 1/1997 |
| JP | 09186562 | | 7/1997 |
| JP | 7-303119 | | 11/1999 |
| SE | 1638795 | * | 3/1991 |

* cited by examiner

Primary Examiner—Chi Pham
Assistant Examiner—Jean Corrielus
(74) Attorney, Agent, or Firm—Katten Muchin Zavis Rosenman

(57) ABSTRACT

The output from a digital signal amplitude regenerator circuit in which the amplitude of a transmitted burst data signal is amplified, and an initial potential generator circuit, are connected to a switch. While there are no burst data, the initial potential generator circuit provides a circuit for compensating for degradation in pulse width comprising a low-pass filter, a pulse width compensation threshold generator circuit, and a limiting amplifier, with an initial potential needed to set a threshold. When a carrier detection signal generator circuit detects the arrival of a burst data signal, a carrier detection signal is outputted, and the switch is switched over from the initial potential to the burst data signal. Thus, the circuit for compensating for the degradation in pulse width located at a later stage can detect a threshold from an optimal initial potential, and thereby the degradation in pulse width can be optimally compensated.

22 Claims, 15 Drawing Sheets

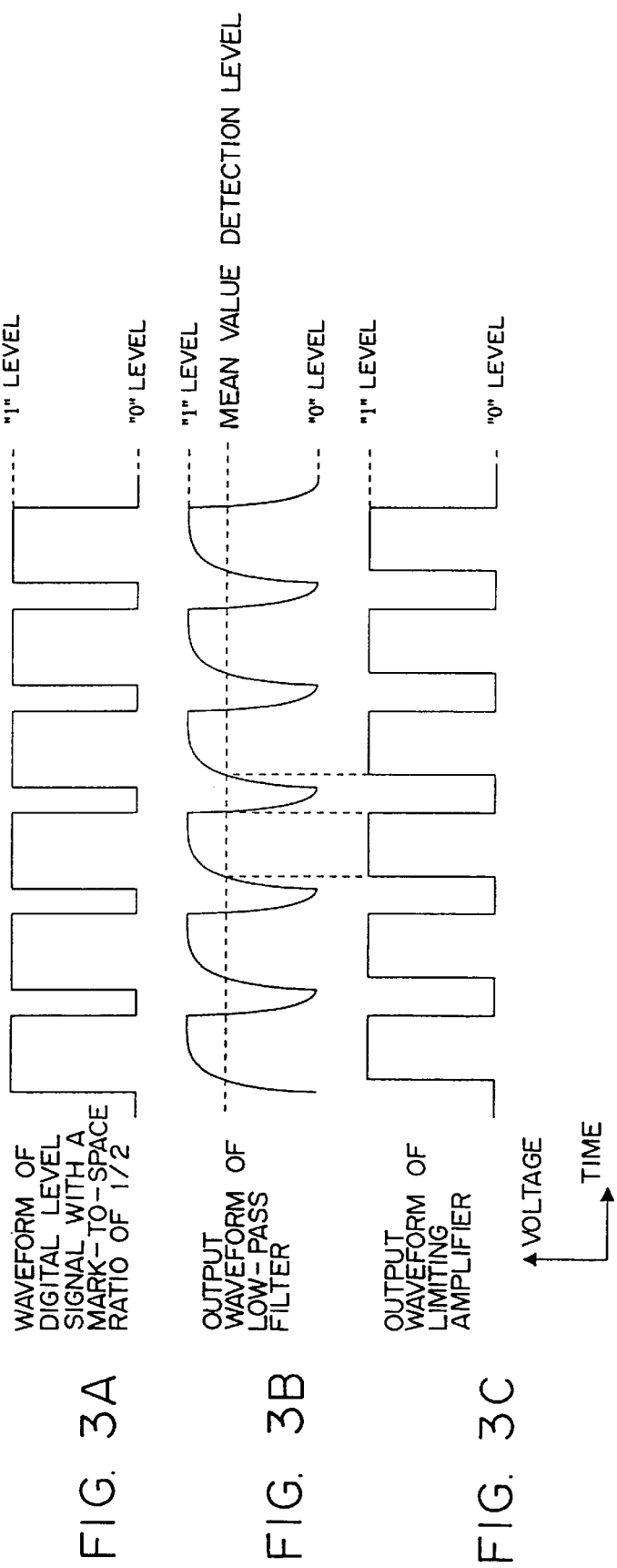

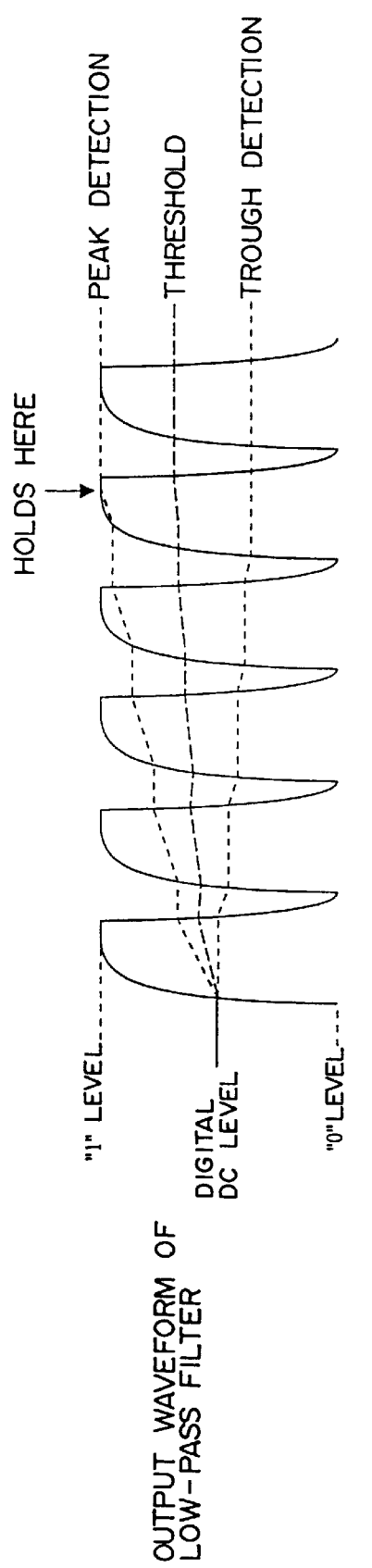
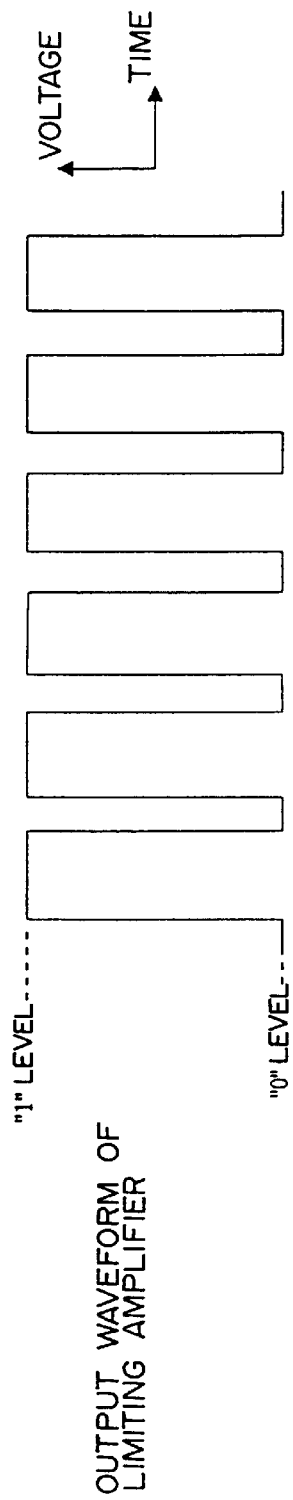
FIG. 7A
FIG. 7B

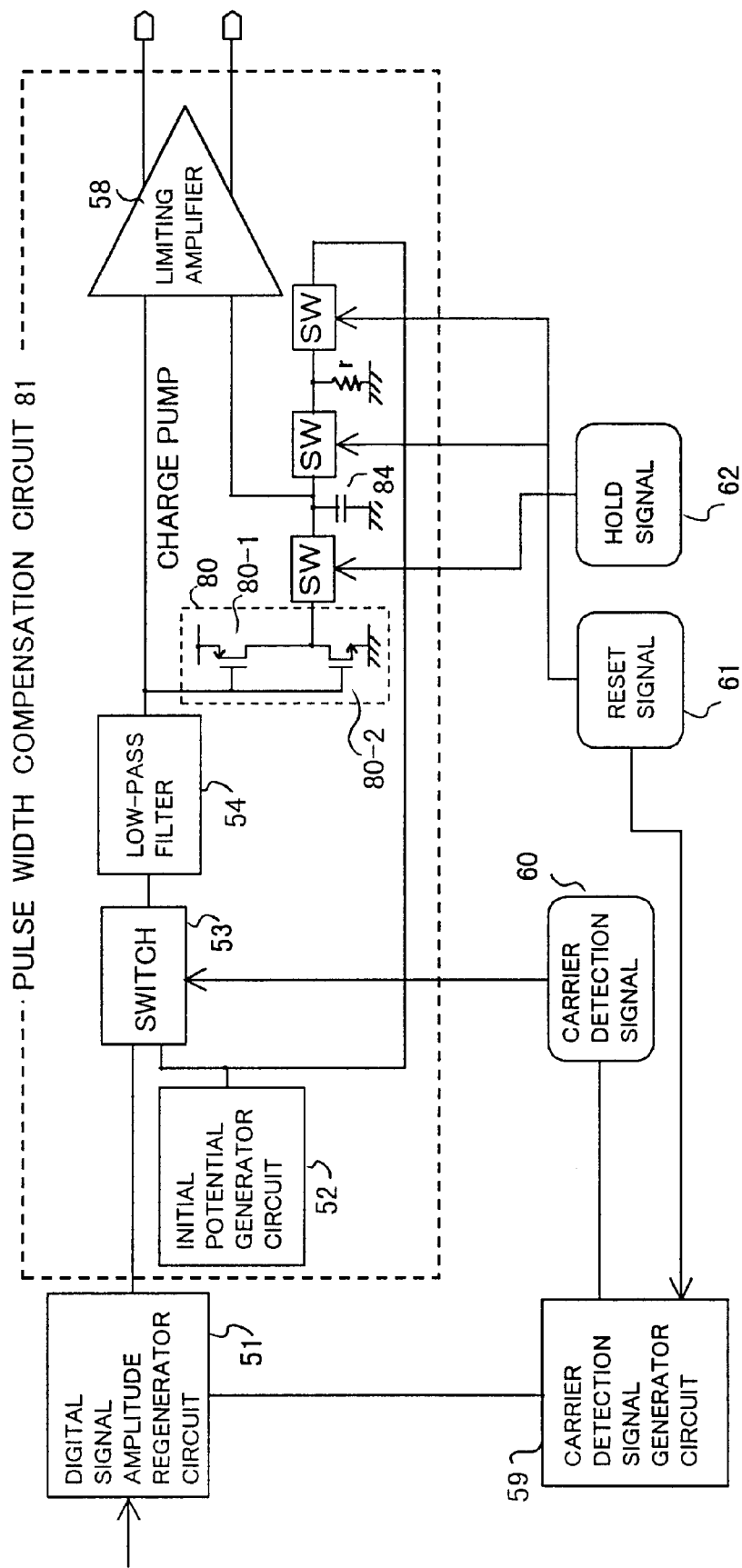
F I G. 9

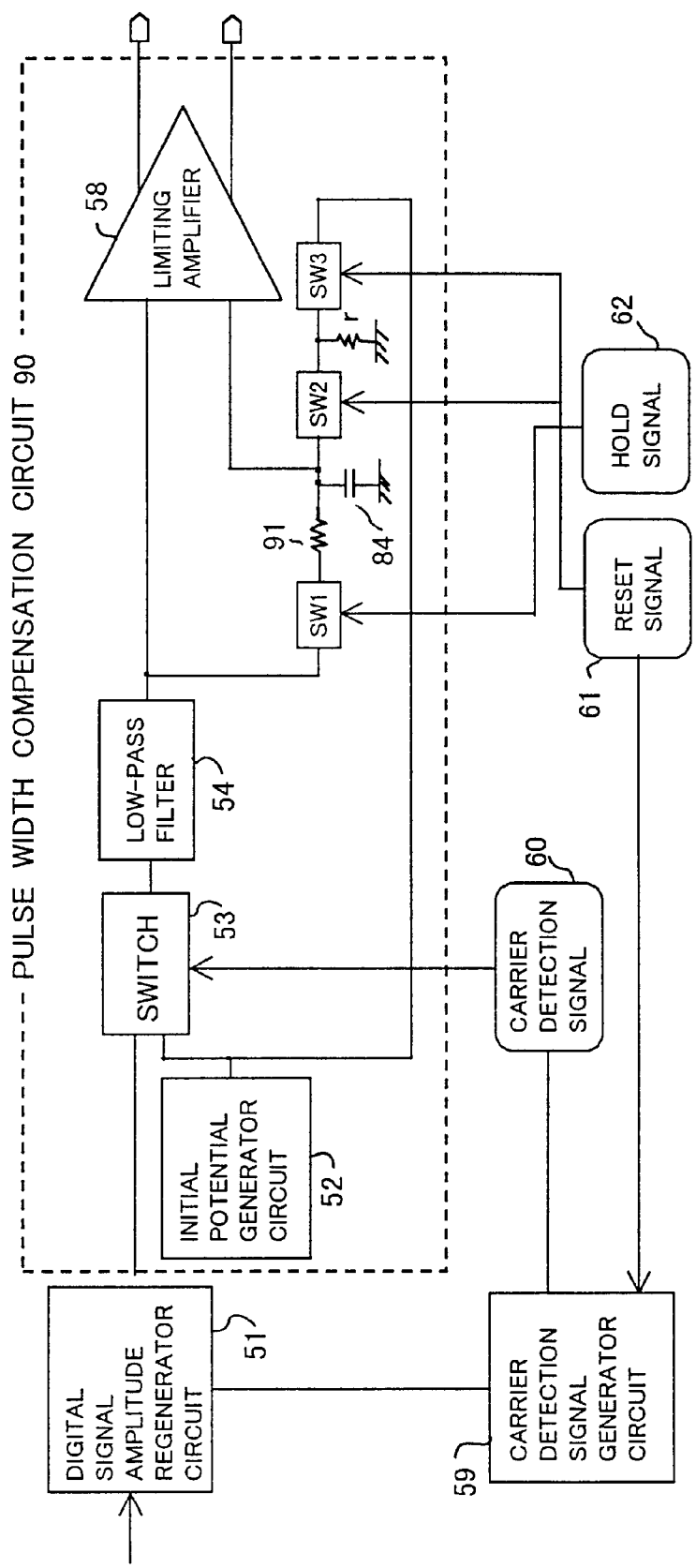
F I G. 10

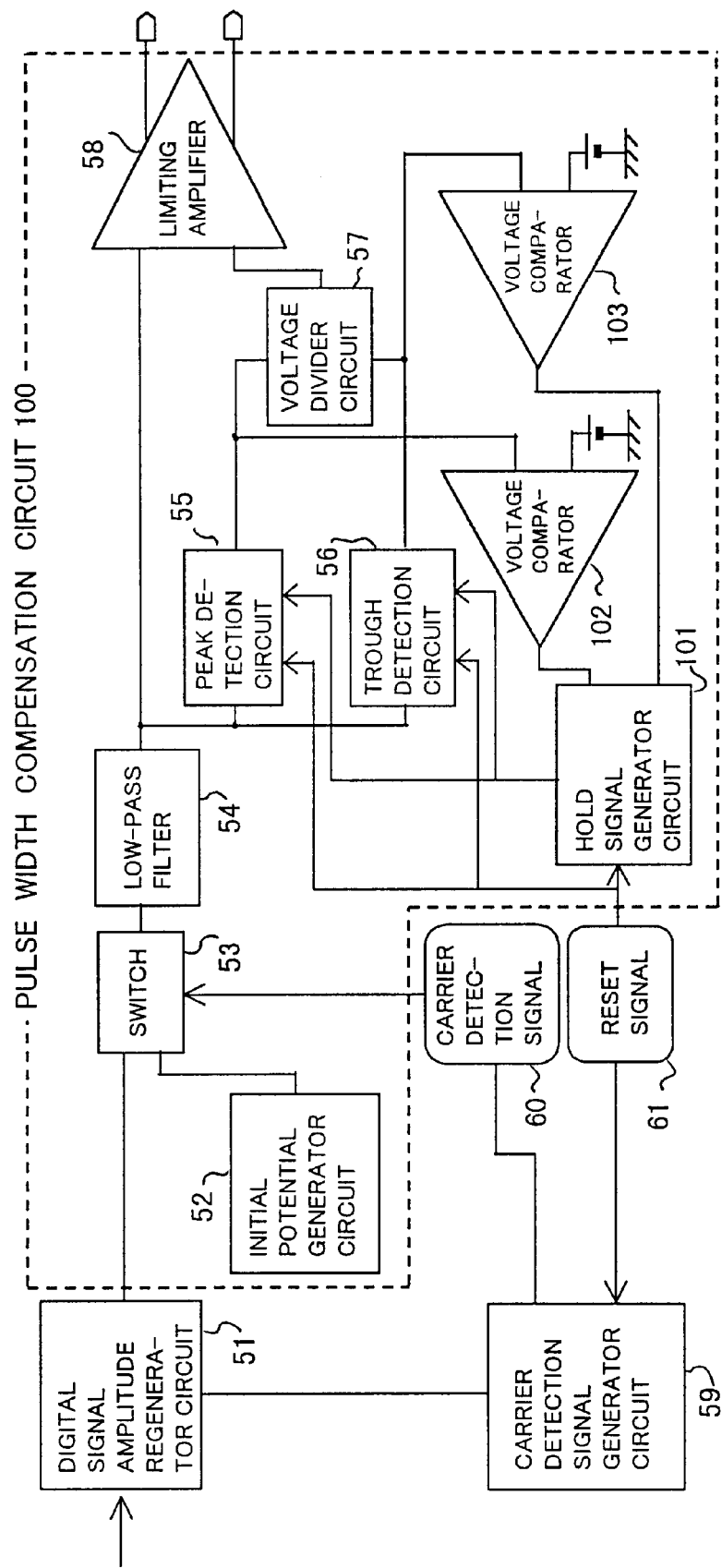
F I G. 11

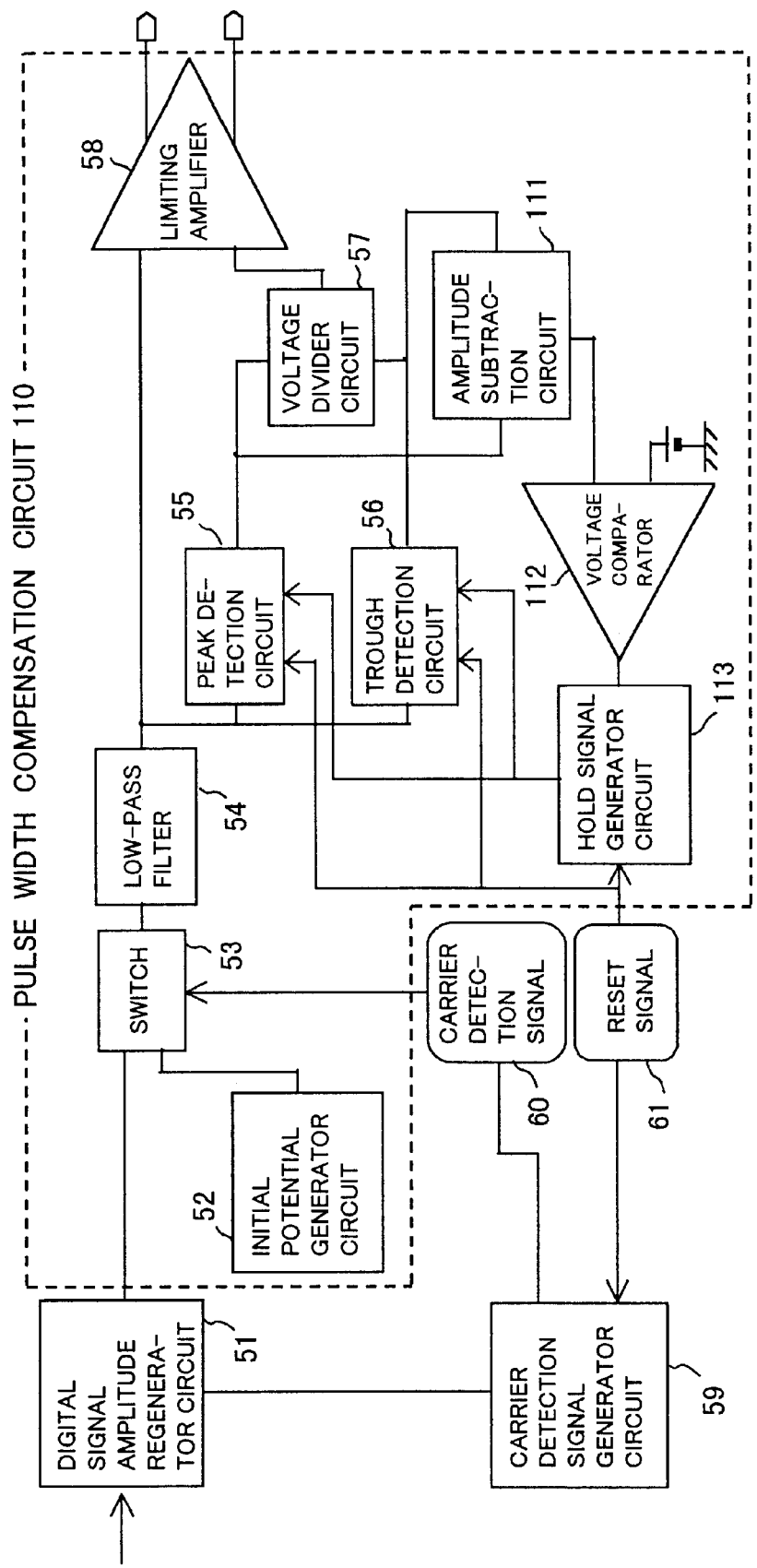
F I G. 12

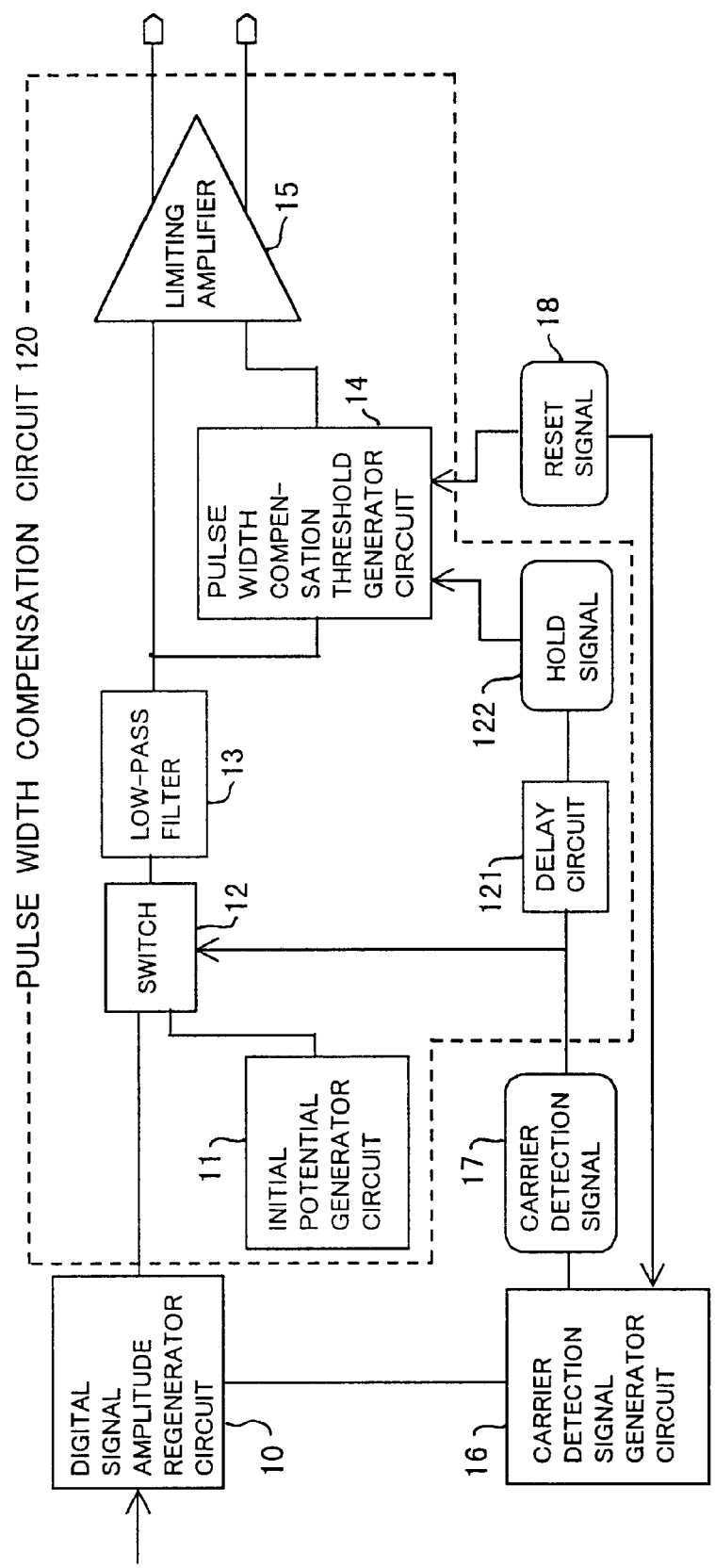
F I G. 13

CIRCUIT AND METHOD FOR COMPENSATING FOR DEGRADATION IN PULSE WIDTH OF BURST DATA

BACKGROUND OF THE INVENTION

1. Field of the Invention

The present invention relates to an apparatus for receiving burst data, and in particular relates to an apparatus for compensating for the degradation of a pulse width generated after being amplified to an original digital level.

2. Description of the Related Art

Lately, in order to improve the efficiency of data communications, an information exchange system for exchanging data in a data format called a "packet" or "cell" has been extensively developed. In the packet or cell format, data are divided into certain lengths, and are transmitted in a burst, if necessary.

Since this burst data (data transmitted in a burst in the format of a packet or cell) of each packet or cell changes because of the transmission environment and conditions, the output which is amplified back to an original digital level in a relay or receiver unit (2R output: output obtained by performing the reshaping and re-timing of an original signal) of each packet differs in the degree pulse width degradation. Accordingly, it is necessary to compensate for the degree of degradation in order to exchange the burst data.

Conventionally, in the transmission of the burst data, attention was focused on the suppression of the degree of pulse width degradation caused during transmission, and the pulse width was regenerated using a flip-flop circuit, etc. when applying a clock signal (3R; performing the reshaping, re-timing and regeneration of an original signal) without compensating for the pulse width degradation generated after being amplified back to an original digital level (2R output). Accordingly, when the data pulse width is degraded and is greater than the clock pulse width at the 2R output, there was a problem that a digital error occurs. On the other hand, in a consecutive data transmission (transmission system for consecutively transmitting data without dividing data into packets or cells) the pulse width is compensated for.

FIG. 1 shows the pulse width compensation circuit for a consecutive data transmission.

In FIG. 1, the system is configured so that an amplitude regenerated digital output may be smoothed using a low-pass filter with a similar cut-off frequency to the transmission speeds and the degradation in the pulse width is compensated for by amplifying this output to a digital signal level again using a limiting amplifier having the mean value of the smoothed signal as a threshold.

That is, a signal with a reduction of amplitude, degradation of waveform, etc. which occur in a digital signal due to the losses, etc. during transmission, is inputted to a digital signal amplitude regenerator circuit 151. The digital signal amplitude regenerator circuit 151 amplifies the amplitude of the inputted digital signal, and compensates for the reduction of the amplitude so that the amplitude of the inputted digital signal may be amplified to the amplitude of the original digital signal. After being amplified up to the amplitude of the original digital signal, the digital signal is inputted to a low-pass filter 152, the high frequency component is removed, and it is smoothed. Then, the AC component only is extracted by a capacitor 155, and a DC component generated by a power supply 156 is added to the AC component. The digital signal processed in this manner is branched into two, with one signal inputted to a limiting amplifier 154, and the other signal to a mean value detector circuit 153. The mean value detector circuit 153 detects a mean value signal level of the digital signal processed as described above, and inputs the mean value to a limiting amplifier 154 as a threshold. If the digital signal directly inputted from the capacitor 155 is bigger than the threshold inputted from the mean value detector circuit 153, the limiting amplifier 154, for example, amplifies the digital signal to a signal level indicating a logical "1". If the digital signal is smaller than the threshold, the limiting amplifier 154 reshapes the signal so that the digital signal becomes a signal level indicating a logical "0".

If the configuration of the pulse width compensation circuit for the conventional consecutive data is applied to a burst data transmission, the above-mentioned mean value is biased to a aside in which no signal is present (the same code side: to the level of constant value) and proper pulse width compensation cannot be made for a time when data are not transmitted (or the same codes continue) for a long time. There is also a problem that a proper pulse width cannot be set, since the mean value also fluctuates according to the mark-to-space ratio.

SUMMARY OF THE INVENTION

It is an object of the present invention to provide a pulse width compensation circuit for compensating for the degradation of a pulse width, after a burst data signal is amplified to an original digital level.

The pulse width compensation circuit in the first aspect of the present invention is a pulse width compensation circuit for compensating for the degradation in pulse width of burst data, comprising a header area of a predetermined mark-to-space ratio, and a data area for storing data, and is characterized in comprising an initial potential generator circuit for providing an initial potential when detecting a threshold for compensating for the degradation in pulse width, a switch for switching the initial potential to a burst data signal when a burst data signal is inputted, a low-pass filter with a similar cut-off frequency to the signal transmission speed, for smoothing the output waveform from the switch, a limiting amplifier for amplifying the output of the above-mentioned low-pass filter and inputting it to a signal input terminal, and a threshold generator circuit for starting a threshold detection for compensating for the degradation in pulse width by switching the switch from the initial potential to the burst data signal when a burst data signal is inputted, terminating the threshold detection before the detection of the header area of the burst data signal is completed, and storing the threshold until the detection of the burst data signal is completed. The burst pulse width compensation circuit is also characterized in connecting the output of the threshold generator circuit to the reference potential terminal of the limiting amplifier, and compensating for the degradation in the pulse width of the burst data signal with the potential inputted to the reference potential terminal as the threshold.

The pulse width compensation circuit in the second aspect of the present invention is a pulse width compensation circuit for compensating for the degradation in pulse width of burst data, and is characterized in comprising a threshold generator circuit for detecting a threshold to compensate for the degradation in pulse width from the transmitted burst data signal, a pulse width compensation circuit for reshaping the pulse width based on a threshold generated by the threshold generator circuit, and an initial potential generator circuit for providing an initial potential when the threshold generator circuit detects a threshold.

The pulse compensation method of the present invention is a pulse width compensation method for compensating for the degradation in pulse width of burst data with a header area of a mark-to-space ratio of 1/2 and a data area for storing data, and is characterized in comprising a step of providing an initial potential when starting a threshold detection for compensating for the degradation in pulse width, a step of switching the initial potential to a burst data signal when a burst data signal is inputted, a step of removing high frequency components for smoothing the waveform of the burst data signal, a step of starting threshold detection for compensating for the degradation in pulse width when inputting a burst data signal, terminating the threshold detection before the detection of the header area of the burst data signal is completed, and storing the threshold until the detection of the burst data signal is completed, and a step of reshaping the pulse width of the smoothed burst data signal based on the threshold.

According to the present invention, since a circuit for compensating for the degradation in pulse width is supplied with an initial potential of a predetermined potential when there is no burst data signal, the setting detection of a threshold used to compensate for the degradation in pulse width can be started from an appropriate potential when a burst data signal is received. That is, if the setting detection of the threshold is performed to compensate for the degradation in pulse width even when there is no burst pulse signal, the threshold often becomes very low because there is noise when there is no burst pulse signal. Therefore, the threshold must be set high when a burst pulse signal is received in this state. Then, the detection goes beyond the header area of the burst data signal before an appropriate threshold is detected, if the detection speed of the threshold detection is slow, and thereby the degradation in pulse width of the data area cannot be appropriately compensated for. If the threshold detection speed is increased, the threshold violently fluctuates on the arrival of a burst data signal, and thereby an accurate threshold cannot be detected. On the other hand, according to the present invention, since an initial potential of a predetermined value is supplied when there is no burst data signal, a sufficiently accurate threshold can be detected within the header area of the burst data signal even if the detection speed is slowed down in order to improve the detection accuracy of the threshold. Accordingly, the degradation in pulse width of the succeeding data area can be appropriately compensated for.

BRIEF DESCRIPTION OF THE DRAWINGS

FIGS. 3A through 3C show the basic operations of the pulse width compensation of the present invention.

FIGS. 5A through 5D show the sequence of control signals needed to embody the present invention.

FIGS. 7A and 7B show the peak and trough detections, threshold change and operations in the first embodiment.

FIG. 9 shows the second embodiment of the present invention.

FIG. 10 shows the third embodiment of the present invention.

FIG. 11 shows the fourth embodiment of the present invention.

FIG. 12 shows the fifth embodiment of the present invention.

FIG. 13 shows the sixth embodiment of the present invention.

DESCRIPTION OF THE PREFERRED EMBODIMENTS

Figure 1:
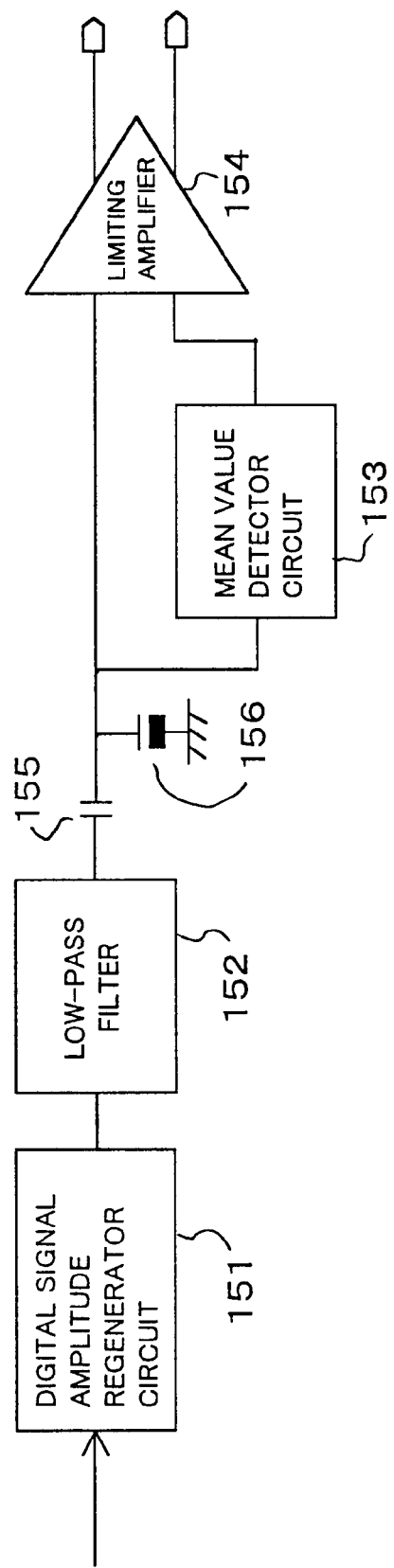
FIG. 1 shows the pulse width compensation circuit in a consecutive data transmission.
Figure 2:
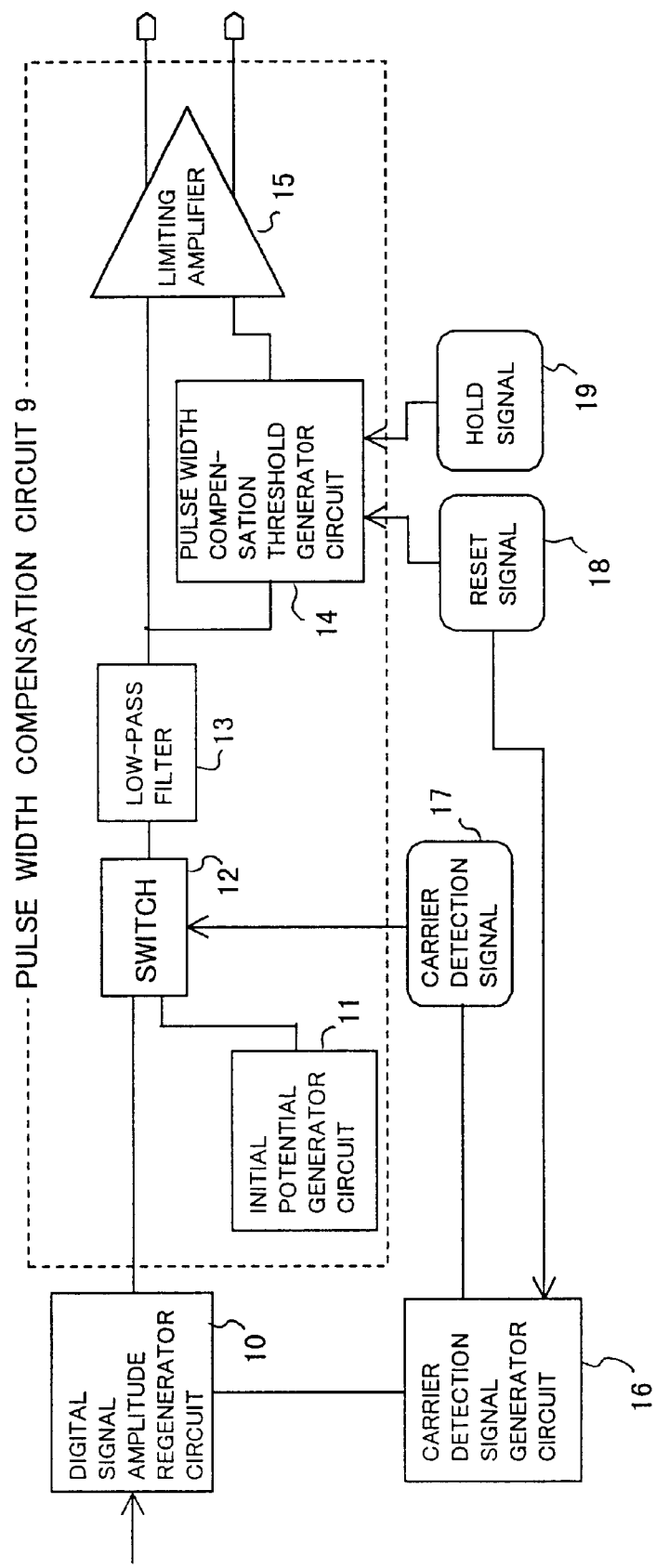
FIG. 2 explains the principle of the present invention.

FIG. 2 explains the principle of the present invention.

A pulse width compensation circuit 9 of the present invention comprises an initial potential generator circuit 11, a switch 12, a low-pass filter 13, a pulse width compensation threshold generator circuit 14 and a limiting amplifier 15.

The present invention is configured by connecting the output of a digital level signal amplitude regenerator circuit 10 and the output of the initial potential generator circuit 11 for providing an intermediate potential between the "1" level and "0" level of a digital level signal as an initial value, to the switch 12 for switching the outputs using a carrier detection signal 17, branching the output from the switch 12 into two after passing the output through the low-pass filter 13 with a similar cut-off frequency to the signal transmission speed, connecting one branched signal to the signal input terminal of the limiting amplifier 15, connecting the other branched signal to the pulse width compensation threshold generator circuit 14 controlled by a reset signal 18 and the signal 19, and generating the threshold level to compensate for the degradation in pulse width, and connecting the output of the pulse width threshold generator circuit 14 to the reference potential terminal of the limiting amplifier 15.

The digital signal amplitude regenerator circuit 10 amplifies digital signals of which the amplitude is degraded, up to the amplitude of the original digital signal in the same manner as described in the pulse width compensation circuit of the above-mentioned consecutive data transmission. A carrier detection signal generator circuit 16 is connected to the input side of the digital signal amplitude regenerator circuit 10, and judges whether or not a carrier of burst data to be transmitted has arrived. Since only a low-level noise is inputted when there is no burst data, the carrier detection signal generator circuit 16 is configured so that it is judged that the carrier of the burst data is inputted when a high-level signal has arrived. In this case, a signal level threshold for detecting the difference in level between the noise and the carrier of the burst data and recognizing each of the levels is set in the carrier detection signal generator circuit 16. This threshold should be set to an appropriate value by the designer when the circuit is configured.

The output of the digital signal amplitude regenerator circuit 10 is connected to one input terminal of the switch 12, and the output of the initial potential generator circuit 11 is connected to the other input terminal of the switch 12. The input from the initial potential generator circuit 11 is a constant potential, which is connected to the switch 12, and while there is no burst data, this constant potential is input to the low-pass filter 13. When the carrier detection signal generator circuit 16 detects the carrier signal of burst data, a carrier detection signal 17 is generated and is applied to the switch 12. The switch 12 switches the input terminals according to the application of this carrier detection signal 17, and inputs the digital signal from the digital signal amplitude regenerator circuit 10 to the low-pass filter 13.

As described earlier, the low-pass filter 13 possesses a similar cut-off frequency to the speed of the digital signal, and smooths the waveform of the digital signal. The output of the low-pass filter 13 is branched, one of the outputs is inputted to a limiting amplifier 15, and the other is inputted to a pulse width compensation threshold generator circuit 14. The pulse width compensation threshold generator circuit 14 receives a reset signal 18 synchronous with the transmission timing of the burst data from a transmission system of burst data, and resets the threshold to a value obtained from the initial potential generator circuit 11. The reset signal 18 is also inputted to the carrier detection signal generator circuit 16, which resets the output of the carrier detection signal 17, and connects the input terminal of the switch 12 to a potential from the initial potential generator circuit 11. A hold signal 19 is used for the pulse width compensation threshold generator circuit 14 to provide the timing for storing the threshold obtained from the burst digital signal from the digital signal amplitude regenerator circuit 10 for as long as the burst digital signal continues. The hold signal 19 can be generated in the burst pulse width compensation circuit 9 or can be received from the transmission system of burst data as a signal synchronous with the burst data.

The threshold generated by the pulse width compensation threshold generator circuit 14 is inputted to the limiting amplifier 15, and compensates for the degradation in pulse width based on the digital signal inputted from the low-pass filter 13 of which the waveform is smoothed.

FIGS. 3A through 3C shot the basic operations of the pulse width compensation of the present invention.

Pulse width compensation is performed by smoothing a digital level signal with a mark-to-space ratio of 1/2 in which the pulse width is degraded, using a low-pass filter with a similar cut-off frequency to the signal transmission speed, performing a threshold detection reflecting the pulse width, such as a mean value detection, and amplitude-amplifying the pulses using the obtained threshold as the reference potential of a limiting amplifier.

Generally speaking, in the case of data in the format of a packet or cell, although the mark-to-space ratio of the data area is not determined to be 1/2, a predetermined bit number of the header area with a mark-to-space ratio of 1/2 is usually attached at the head. Thus, in the present invention, a threshold detection process for compensating for the degradation in pulse width is performed using this header area with a mark-to-space ratio of 1/2. For example, this threshold is assumed to be a detection level of the mean value of the header area with a mark-to-space ratio 1/2. When the mark-to-space ratio is not 1/2, though it is necessary to appropriately set the voltage division ratio of a voltage divider circuit described later, etc., this should be appropriately set in the design stage by a person having ordinary skill in the art, and the present invention is not necessarily limited to the mark-to-space ratio 1/2.

FIG. 3A shows the signal waveform inputted to the low-pass filter shown in FIG. 2, and although the signal level values of a "1" level and a "0" level are reproduced by the digital signal amplitude regenerator circuit 10, the pulse width is left degraded. That is, although the mark-to-space ratio should be 1/2, the mark-to-space ratio differs from 1/2 due to the degradation of the pulse width. In the case of FIG. 3A, the pulse width is extended.

FIG. 3B shows the signal waveform obtained after the digital signal shown in FIG. 3A has passed through the low-pass filter 13. The low-pass filter 13 possesses a similar cut-off frequency to the transmission speed of the digital signal, and the pulse width of the outputted signal waveform becomes wide near the "0" level and narrow near the "1" level. Thus, the reproduced pulse width can be made wider or narrower by binarizing such a waveform using an appropriate threshold. In FIG. 3B, using the detection level of the mean value as the threshold is assumed, and since the mean value detection level becomes high when the pulse width is extended as shown in FIG. 3A, a pulse is reproduced using the part near the "1" level of the waveform shown in FIG. 3B.

The limiting amplifier is reproduces a waveform as shown in FIG. 3C, from the smoothed waveform using a threshold. Since it is assumed here that a mean value detection level is used for the threshold, and the level is set near the "1" level, the pulse width reproduced by the limiting amplifier becomes narrow, as can be clearly seen by comparing FIG. 3A with FIG. 3C.

In this way, a pulse with a narrower width can be reproduced from a pulse with an extended width, and the original mark-to-space ratio of 1/2 may be restored. Conversely to the above, if the width of the digital signal inputted to the low-pass filter is narrow due to the waveform degradation, the mean value detection level shown in FIG. 3B becomes near the "0" level, and the signal smoothed by the low-pass Filter 13 is cut in the wide part of the waveform shown in FIG. 3B, to provide the required threshold to the limiting amplifier 15. Thus, the pulse width of the digital signal reproduced by the limiting amplifier 15 becomes wider.

That is, the burst data of each packet changes in the degree of pulse width degradation at the 2R output, and the mark-to-space ratio of the data area is not necessarily 1/2. Therefore, in the present invention, for the burst data, a threshold detection reflecting the inputted pulse width, such as a mean value detection in an area with a mark-to-space ratio of 1/2 is performed at a high speed, the detection is terminated before the data area appears, during the time the data area appears, the obtained threshold is held, and the threshold is reset before the next data packet comes.

In order to improve the speed and accuracy of the pulse width compensation of the present invention when detecting the threshold, generally speaking it is necessary that a time period where a mark-to-space ratio is 1/2 is sufficiently long. In the burst data, although a long period is required in the header area, the header area cannot be made very long from the viewpoint of data transmission efficiency. In this case, although it is considered to increase the speed of the threshold detection, a threshold becomes unstable, since the threshold changes with each pulse.

Accordingly, in the pulse width compensation, two contradicting propositions must be simultaneously solved; one is that the speed of threshold detection must be made as low as possible in order to improve the accuracy of a threshold, and the other is that information on pulse width must be detected within a limited time period.

Against these problems the present invention has an advantage that since in the present invention the threshold detection is performed for digital signals with a fixed DC level and a fixed signal amplitude, a speed needed to follow the digital signals is fixed. Furthermore, by providing an initial value as the DC level, the threshold detection is performed in the direction of a threshold level where the pulse width is compensated for from the beginning of the threshold detection, and thereby the detection speed can be reduced. Thus, a more accurate threshold detection for compensating for the pulse width can be implemented within a limited time period. The initial value is switched over by a switch, because, generally speaking, signals with amplified noise are outputted at a digital output during the time period from input of the reset signal to input of the carrier detection signal thereby the DC level of the digital signal is not necessarily outputted.

Figure 4A:
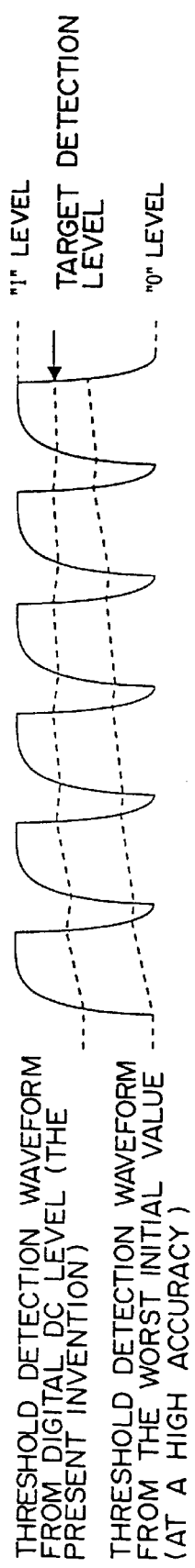
FIGS. 4A and 4B explain the concept of the threshold detection of the present invention.
Figure 4B:
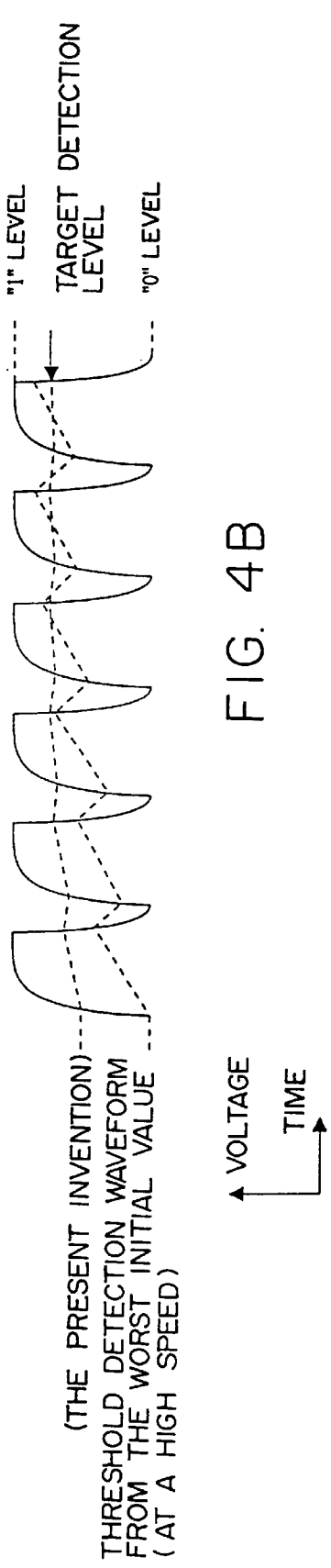

FIGS. 4A and 4B explain the concept of the threshold detection of the present invention.

When a mean value detection for a threshold of a digital signal is performed, there is no problem while burst data are being transmitted. However, if there are no burst data, noise is amplified, so 2R output is not necessarily at a digital level. Therefore, when a mean value detection is performed, in the worst case there is a possibility that the level in the case where a mean value is detected as a threshold before burst data are inputted may be a "0" level or "1" level. If the burst data are inputted in this state, the signal level suddenly rises, and thereby a circuit for performing the mean value detection has to follow the sudden change of the signal level. FIG. 4A shows the case where the mean value detection of burst data is performed with high accuracy. In this case, if a mean value detection for a threshold is performed from the worst initial value ("0" level) with a high accuracy, it takes a long time to reach a target detection level, and thereby the target detection level cannot be reached within a header area with a limited number of bits.

On the other hand, in the present invention, since the threshold detection is started from the digital level provided by the initial potential generator circuit 11 as shown in FIG. 2, a threshold with a high accuracy can quickly be obtained as a result of a mean value detection as shown in FIG. 4A, and the target detection level can be easily reached by the completion of the detection of the header area with a mark-to-space ratio of 1/2, even if the detection speed is low.

As shown in FIG. 4B, it is necessary to increase the detection speed in order to avoid the case shown in FIG. 4A when the present invention is not adopted. In this case, although the mean value detection for a threshold is started from the worst initial value, the detection can reach near the target level quickly. However, as shown in FIG. 4B, the detected level violently fluctuates, and thereby the target detection level cannot be accurately caught.

On the other hand, according to the present invention, since the detection is started from a certain level, the detection accuracy can be improved. Accordingly, the fluctuation in the detection level can be suppressed, and thereby the target detection level can be accurately caught.

FIGS. 5A through 5D show the sequence of control signals needed to embody the present invention.

A burst data signal shown in FIG. 5B comprises a header area with such a mark-to-space ratio of 1/2 as an alternate number of "1" and "0" at the head, and a data area following the header area. A reset signal shown in FIG. 5C is issued for several bits after the detection of the first burst data is completed until the next burst data are inputted. A carrier detection signal shown in FIG. 5A is issued when the burst data are inputted, and is canceled when the detection of the data is completed or the reset signal is inputted. A hold signal shown in FIG. 5D is issued before the detection of the header area of the burst data is completed, and is canceled when the detection of the data is completed or the reset signal is inputted.

Explanation is made with reference to FIG. 2.

In an initial state the switch 12 is connected to the initial potential generator circuit 11, and is switched to the digital level signal output from the digital signal amplitude regenerator circuit 10 by a carrier detection signal 17. The output from the switch 12 is branched into two after passing through the low-pass filter 13; one branched signal is connected to the signal input terminal of the limiting amplifier 15, and the other branched signal is connected to the pulse width compensation threshold generator circuit 14. The pulse width compensation threshold generator circuit 14 starts the threshold detection for compensating for the degradation in pulse width by the issuance of reset signal 18 along with the switching of the switch 12, terminates the threshold detection using a hold signal, holds the threshold, and provides the threshold to the reference potential terminal of the limiting amplifier 15. When a reset signal 18 is issued, the carrier detection signal 17 is cancelled, the switch 12 is again connected to the initial potential generator circuit 11, and the output potential of the pulse width compensation threshold generator circuit 14 returns to the initial potential by the reset signal.

Although the reset signal of FIG. 5C and hold signal of FIG. 5D as described above are provided, the hold signal can also be generated in the burst pulse width compensation circuit 9. In the description below the reset signal is still assumed to be provided by the transmission system of the burst data.

Figure 6:
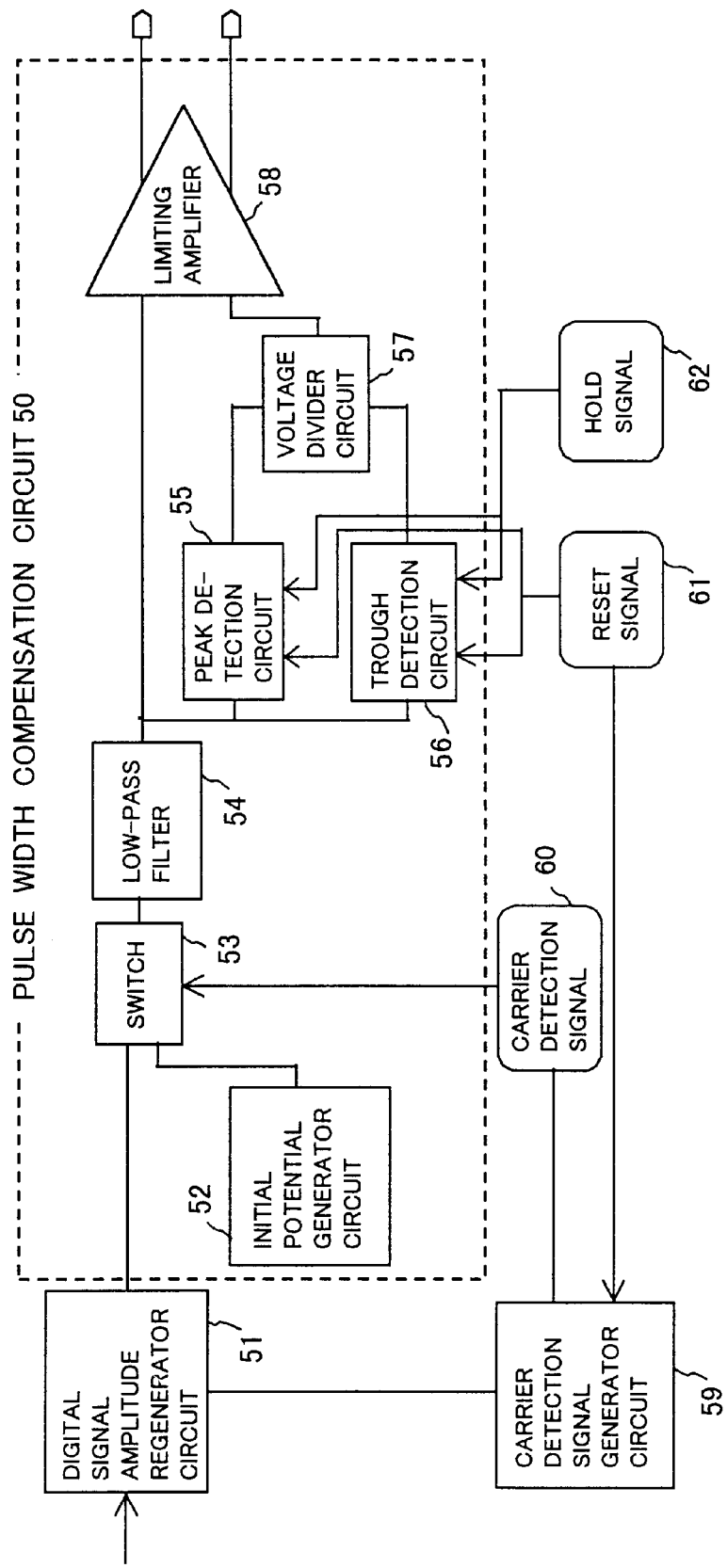
FIG. 6 shows the first embodiment of the present invention.

FIG. 6 shows the first embodiment of the present invention.

In the configuration shown in FIG. 6, a pulse width compensation threshold generator circuit 50 includes a peak detector circuit 55 and a trough detector circuit 56, in which amplitude detection volume per unit time is restricted, and a voltage divider circuit 57. The peak and trough detector circuits 55 and 56 enter a voltage-follower state, and return to the initial potential during the time period in which the reset signal is input.

In the configuration of FIG. 6, a digital signal amplitude regenerator circuit 51 amplifies inputted digital signals, and the output is inputted to a switch 53. A carrier detection signal generator circuit 59 is connected to the input side of the digital signal amplitude regenerator circuit 51, and detects the carrier of the burst data. The output terminal of the switch 53, at first, is connected to an initial potential generator circuit 52 for providing a certain voltage, and is switched by a carrier detection signal 60 generated by the carrier detection signal generator circuit 59 to transfer a signal from the digital signal amplitude regenerator circuit 51 to a low-pass filter 54. The digital signal is smoothed by passing through the low-pass filter 54 and is inputted to a limiting amplifier 58, and is simultaneously inputted to the peak detector circuit 55 and the trough detector circuit 56. When a reset signal is inputted, the peak detector circuit 55 and the trough detector circuit 56 reset a voltage value stored in the peak and the trough detector circuit 55 and 56, and start a new voltage detection. The peak detector circuit 55 detects the peak potential of a pulse of the burst data signal, and the trough detector circuit 56 detects the trough potential of a pulse of the burst data signal. However, such a high-speed detection so as to completely catch the potential with one bit is not performed. The detection speed is adjusted so that, for example, when the pulse width of the burst data signal is wide, the result of dividing the voltage detected by the peak detector circuit 55 and the voltage detected by the trough detector circuit 56 using the voltage divider circuit 57 may become close to the peak potential of the burst data signal. In the same way, when the pulse width of the burst data signal is narrow, the detection speed is adjusted so the result of dividing the detected voltages by the voltage divider circuit 57 may become close to the trough potential of the burst data signal. The peak detector circuit 55 and the trough detector circuit 56 hold the potential close to the peak potential and the potential close to the trough potential of the burst data signal respectively. The output of the voltage divider circuit 57 is inputted to the limiting amplifier 58 as a threshold potential for pulse width compensation, whereby the degradation in pulse width is compensated for.

FIGS. 7A and 7B show the peak and trough detections, threshold change and operations of the first embodiment.

As shown in FIGS. 7A and 7B, since in the peak and trough detections where a detected volume per one bit is restricted, each detection operates according to the pulse width, and the threshold continues to come near to a wider pulse width until either the peak detection or the trough detection completely catches the digital signal level. Therefore, a pulse width compensation effect is obtained by terminating the detection before either the peak detection or the bottom detection reaches the digital signal level. That is, since, if the width of a part corresponding to the "1" level of a pulse is wider than the width of a part corresponding to the "0" level of the pulse, the change volume per signal cycle of the peak detection value becomes bigger than the change volume per signal cycle of the trough detection value by the difference of the widths of the "1" level and the "0" level, and the threshold of the peak detection value becomes higher because of the lowering of the threshold of the trough detection value. Conversely, since, if the width of a part corresponding to the "0" level of a pulse is wider than the width of a part corresponding to the "1" level of the pulse, the change volume per signal cycle of the trough detection value becomes bigger than the change volume per signal cycle of the peak detection value by the difference of the widths of the "1" level and the "0" level, and the threshold of the trough detection value becomes lower because of the rising of the threshold of the peak detection value.

For example, FIGS. 7A and 7B show the case where the input pulse width to a pulse width compensation circuit 50 is wider than the original pulse width, and when starting the peak detection and trough detection from the digital DC level outputted by an initial potential generator circuit 52, the peak detection circuit 55 detects the "1" level of a waveform outputted from the low-pass filter 54 faster than detection of "0" 1 level by the trough detection circle 56. Meanwhile, the trough detection circuit 56 does not detect the "0" level of the waveform outputted from the low-pass filter 54. Therefore, a value close to the "1" level can be obtained for the mean value of a threshold provided by the voltage divider 57. At this time, the peak detection value and the trough detection value are stored by a hold signal, and the degradation in pulse width of the data area following the header area with a mark-to-space ratio of 1/2 is compensated for. FIG. 7B shows the result of a limiting amplifier 58 compensating for the degradation in pulse width based on the threshold obtained in the process shown in FIG. 7A.

Figure 8:
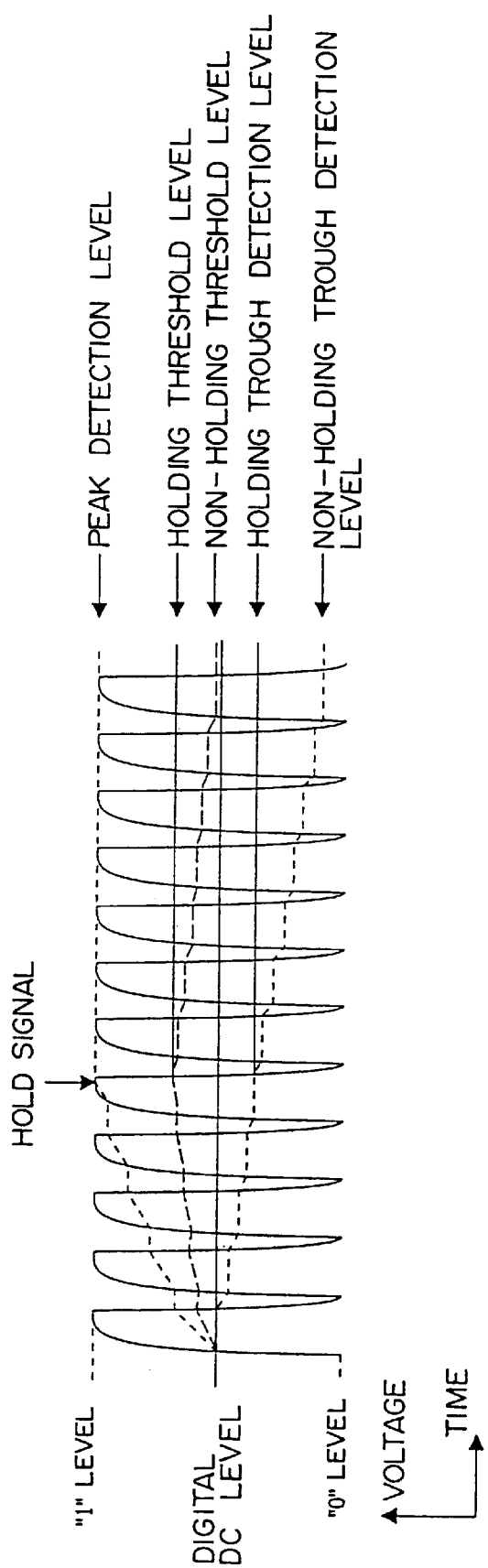
FIG. 8 explains the role of a hold signal.

FIG. 8 explains the role of a hold signal.

When a peak detection and a trough detection are performed from the digital DC level provided by the initial potential generator circuit 52, in the case shown in FIG. 8, the peak detection circuit 55 detects the peak potential of a pulse faster than the trough detection circuit 56. In the present invention, at this time, both the peak detection level and the trough detection level are stored by a hold signal. Thus, a process for narrowing the pulse width of a burst signal with an extended pulse width can be performed by holding the threshold close to the "1" level. However, if there is no hold signal, as shown as a non-holding trough detection level in the diagram, the bottom detection circuit 56 tries to detect the "0" level of the output from the low-pass filter, and the detection level gradually falls. On the other hand, since the peak detection circuit 55 has already detected the "1" level, the peak detection level is fixed to this level. Accordingly, when there is no holding, the level of the threshold being a mean value between the peak detection level and the trough detection level gradually falls, and behaves as shown by a non-holding threshold level in the diagram. If the degradation in pulse width is tried to be compensated for using this threshold with a diminished level, the width of the pulse can only be narrowed to a lesser degree.

Conversely, if the original burst pulse width is narrow, the trough detection circuit 56 detects the "0" level first, and then the peak detection circuit 55 gradually tries to detect the "1" level. At this time, the threshold level must be low in order to extend the pulse width. If there is no holding, the threshold level rises as the peak detection level gradually rises, and thereby an extension of the pulse width becomes unavailable.

As described above, this embodiment is configured so that the degradation in pulse width may be compensated for by decreasing the speed of the peak detection and trough detection and holding the peak detection level and trough detection level by a hold signal after an appropriate detection time.

FIG. 9 shows the second embodiment of the present invention.

In the diagram the same components as shown in FIG. 6 have the same reference numbers as shown in FIG. 6.

In the pulse width compensation circuit 81 of this embodiment, a switch SW1 is turned off only while there is a hold signal, and switches SW2 and SW3 are turned on only while there is a reset signal. In FIG. 9, a resistor "r" has a value sufficient to reset the capacitor 84 sufficiently fast. In the configuration shown in the diagram, a charge corresponding to the pulse width is discharged or charged in a capacitor 84 by the operation of a charge pump 80, a threshold voltage reflecting the pulse width is generated across the capacitor 84, the capacitor 84 is separated from the charge pump 80 by the switch SW1 while the detection is performed for a mark-to-space ratio of 1/2, and the pulse width is compensated for by storing the threshold.

The switch 53 switches the output of a digital signal amplitude regenerator circuit 51 to the output of an initial potential generator circuit 52 based on a carrier detection signal 60 generated by a carrier detection signal generator circuit 59, and vice versa. The output of the initial potential generator circuit 52 is applied to the capacitor 84 through the switches SW2 and SW3, and is also applied to a limiting amplifier 58 as an initial value of the threshold while there is a reset signal. At this moment, although the switch SW1 is on, the switch SW1 being on hardly affects the threshold since the voltage supplied from the charge pump 80 corresponds to noise. When the reset signal is canceled, the switches SW2 and SW3 are turned off, and the capacitor 84 receives voltage only through the charge pump 80. When the reset signal is canceled, the capacitor 84 is supplied with voltage by burst data through the charge pump 80, since the carrier of burst data is almost simultaneously inputted.

The charge pump 80 comprises different types of transistors 80-1 and 80-2. For example, the charge pump 80 is configured so that when a signal from the low-pass filter 54 has a high potential, the transistor 80-1 is turned on, and when a signal from the low-pass filter 54 has a low potential, the transistor 80-2 is turned on. In this case, the transistors 80-1 and 80-2 are configured so that current discharged from the capacitor 84 and current charged to the capacitor 84 become equal if the mean voltage is equal to an initial potential. Accordingly, when the pulse width of the burst data is wide, the on- time of the transistor 80-1 becomes long, a high charge is stored in the capacitor 84, and the potential as a threshold to be applied to the limiting amplifier 58 becomes high. Conversely, when the pulse width of the burst data is narrow, the on-time of the transistor 80-2 becomes long, a high charge is removed from the capacitor 84, and the potential as a threshold to be applied to the limiting amplifier 58 becomes low.

The potential obtained in this manner and generated by the charge stored in the capacitor 84 as a threshold is stored by turning off the switch SW1 according to the input of the hold signal 62, and the degradation in pulse width is compensated for while the data area of the burst data is inputted.

FIG. 10 shows the third embodiment of the present invention.

In the diagram the same components as shown in FIG. 9 have the same reference numbers as shown in FIG. 9.

In the pulse width compensation circuit 90 of this embodiment, a switch SW1 is turned off only while there is a hold signal 62, and switches SW2 and SW3 are turned on only while there is a reset signal 61.

In the diagram a resistor "r" has a value sufficient to reset the capacitor 84 sufficiently fast. A threshold corresponding to the pulse width can be obtained by a mean value detection, the mean value detection is terminated while the detection is performed for a mark-to-space ratio of 1/2, and the degradation in pulse width is compensated for by storing the threshold.

The burst data signal of which the amplitude is restored by a digital signal amplitude regenerator circuit 51 is inputted to a low-pass filter 54 through a switch 53, and the waveform is smoothed. When there is no burst data signal in the digital signal amplitude regenerator circuit 51, the switch 53 is switched over so that the voltage of an initial potential generator circuit 52 may be applied to a limiting amplifier 58 and the SW1 side through the low-pass filter 54, since a carrier detection signal 60 is not outputted from a carrier detection signal generator circuit 59. When a reset signal 61 is issued, the switches SW2 and SW3 close, the output voltage of the initial potential generator circuit 52 is applied to a capacitor 84, and the limiting amplifier 58 is provided with the initial potential for the threshold detection. Then, when the reset signal 61 is canceled, the switches SW2 and SW3 open, and a signal from the low-pass filter 54 is applied to the capacitor 84. When there is no carrier signal, the voltage of the initial potential generator circuit 52 is applied to the capacitor 84 through the switch 53, the low-pass filter 54, the switch SW1 and a resistor 91. When a carrier detection signal 60 is inputted to the switch 53, the burst data signal outputted from the digital signal amplitude regenerator circuit 51 and obtained through the low-pass filter 54 of which the waveform is smoothed is applied to the capacitor 84 through the switch SW1 and the resistor 91. At this moment, a voltage corresponding to the pulse width of the inputted burst data signal is generated across the capacitor 84 by the operation of the resistor 91 and the capacitor 84. Then, the switch SW1 is opened by a hold signal 62, the potential across the capacitor 84 is stored, and the potential is inputted to the reference terminal of the limiting amplifier 58. As described earlier, the limiting amplifier 58 restores the original waveform width of a burst data signal in which the waveform is degraded with the potential inputted from the reference terminal as the threshold and outputs the restored burst data signal.

FIG. 11 shows the fourth embodiment of the present invention.

In the diagram the same components as shown in FIG. 6 have the same reference numbers as shown in FIG. 6.

In this configuration the pulse width compensation circuit 100 of this embodiment compares the output of the peak detection circuit 55 and the output of the trough detection circuit 56 with the reference amplitude set by voltage comparators 102 and 103, respectively, the pulse width compensation circuit 100 issues a hold signal for terminating the detection when either of the outputs becomes greater or smaller than the reference amplitude, and the pulse width is compensated for without receiving an external hold signal by canceling a carrier detection signal or canceling the hold signal using a reset signal 61.

In this embodiment, since a hold signal is generated, the output of the peak detection circuit 55 and the output of the trough detection circuit 56 are inputted to the voltage comparators 102 and 103, respectively. A reference voltage is inputted to each of the voltage comparators, and whether or not the peak detection level detected by the peak detection circuit 55 is higher than a predetermined level is detected using the voltage comparator 102. Whether or not the trough detection level detected by the bottom detection circuit 56 is lower than a predetermined level is detected using the voltage comparator 103. The system is configured so that the detected results of the voltage comparators 102 and 103 may be inputted to a hold signal generator circuit 101, and when either the output of the peak detection circuit 55 or the output of the trough detection circuit 56 becomes greater or smaller than the predetermined level against the reference voltage, a hold signal may be outputted.

The output of the hold signal is stopped by canceling the reset signal 61 received from a transmission system of burst data signals. For this reason, the reset signal 61 is inputted to the hold signal generator circuit 101. Although not shown in the diagram, instead of the reset signal 61 a carrier detection signal 60 can also be inputted to the hold signal generator circuit 101. In this case, it is considered that the cancellation of the hold signal is synchronized with the cancellation of the carrier detection signal 60.

The other operations are the same as described above with reference to FIG. 6 through FIG. 8. That is, after the burst data signal of which the original signal amplitude is reproduced by a digital signal amplitude regenerator circuit 51 is transferred to the low-pass filter 54, which is switched from the input of an initial potential generator circuit 52 by a switch 53, by a carrier detection signal 60, a peak detection level and a trough detection level are obtained by the peak detection circuit 55 and the trough detection circuit 56, respectively, are potentially divided by a voltage divider circuit 57, and are inputted to the reference voltage of a limiting amplifier 58 as a threshold. The operations of the peak detection circuit 55 and the trough detection circuit 56 are as described above with reference to FIGS. 7A and 7B, and FIG. 8.

FIG. 12 shows the fifth embodiment of the present invention.

In the diagram the same components as shown in FIG. 11 have the same reference numbers as shown in FIG. 11.

In this configuration, the pulse width compensation circuit 110 of this embodiment produces a difference amplitude from the output of a peak detection circuit 55 and the output of a trough detection circuit 56 using an amplitude subtraction circuit 111, the pulse width compensation circuit 110 compares the difference amplitude with a reference amplitude (approximately half of the digital level amplitude) set by a voltage comparator 112, the compensation circuit 110 issues a hold signal for terminating the detection by a hold signal generator circuit 113 when the difference amplitude becomes greater than the reference amplitude, and the pulse width is compensated for without receiving a hold signal from outside by canceling a carrier detection signal or canceling the hold signal using a reset signal 61.

In this embodiment, although a burst data signal from a digital signal amplitude regenerator circuit 51 performs a peak detection and a trough detection of a waveform smoothed by a low-pass filter 54 using the peak detection circuit 55 and the trough detection circuit 56, respectively, the respective output is inputted to an amplitude subtraction circuit 111. In the amplitude subtraction circuit 111 the difference in level of a peak detection level and a trough detection level is measured, and the result is transferred to the voltage comparator 112. The voltage comparator 112 is configured so as to input a voltage of approximately half of the difference in level between the "1" level and the "0" level of a burst data signal as a reference voltage, and compares the level from the amplitude subtraction circuit 111 and the reference voltage to determine whether or not it is greater than the reference voltage.

The hold signal generator circuit 113 receives the detection result from the voltage comparator 112, and outputs a hold signal when the difference in level obtained by the amplitude subtraction circuit 111 becomes greater than the above-mentioned predetermined voltage value. This is, in order to hold a threshold obtained by a voltage divider circuit 57, an appropriate peak detection level and an appropriate trough detection level are obtained when a peak detection and a trough detection are started from an initial value provided by an initial potential generator circuit 52, and after a certain continuation of the detection, a certain difference in level is generated between the peak detection level and the trough detection level.

As described earlier, a hold signal can be canceled when a reset signal 61 is inputted to the hold signal generator circuit 113 or when a carrier detection signal 60 is inputted to the hold signal generator circuit 113.

FIG. 13 shows the sixth embodiment of the present invention.

In the diagram the same components as shown in FIG. 2 have the same reference numbers as shown in FIG. 2.

In this configuration the pulse width compensation circuit 120 of this embodiment compensates for the degradation in pulse width without receiving an external hold signal by obtaining a hold signal 122 for terminating the detection by the issuance of a carrier detection signal 17, using a delay circuit 121, and the cancellation of a carrier detection signal 17 or a reset signal 18.

In this embodiment, a pulse width threshold generator circuit 14 can have any of the configurations shown in FIGS. 6, 9 and 10. In this embodiment a hold signal is obtained by providing the carrier detection signal with an appropriate delay using the delay circuit 121. In this case, although the header area with a mark-to-space ratio of 1/2 appears for a predetermined time after the carrier of a burst data signal is detected, a threshold is generated in this header area. When the threshold is generated using the peak detection level and trough detection level as described earlier, it is necessary to appropriately estimate a delay time provided to the hold signal 122 by the delay circuit 121, since the speeds of the peak detection and trough detection are not set too fast. This delay time shall be set at the design stage of a burst pulse width compensation circuit 120, taking into consideration the number of bits and transmission speed of the header area, time needed to generate the threshold, etc.

As described earlier, the hold signal can be canceled when a reset signal 18 is inputted to a pulse width compensation threshold generator circuit 14, or a carrier detection signal 17 can be directly inputted to the pulse width compensation threshold generator circuit 14, although not shown in the diagram.

Figure 14:
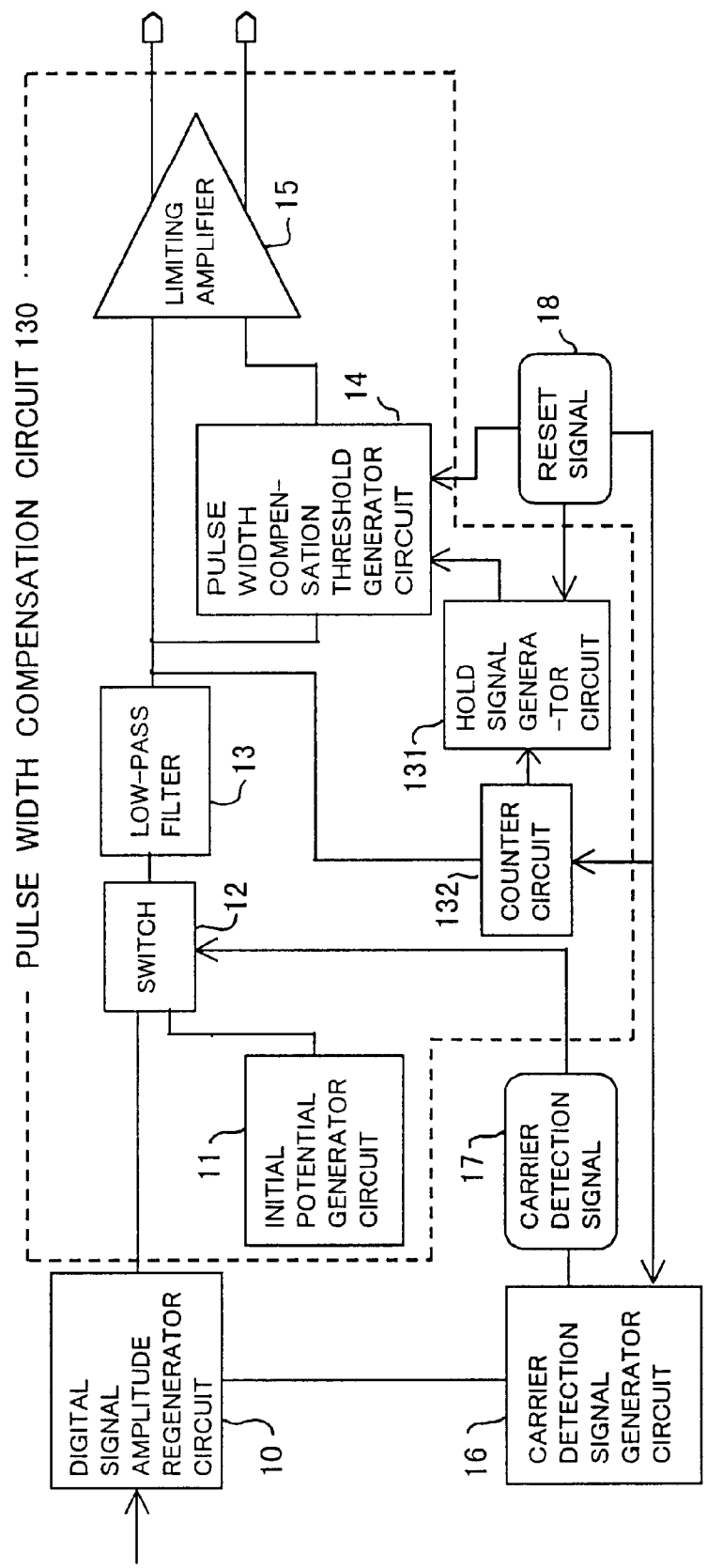
FIG. 14 shows the seventh embodiment of the present invention.

FIG. 14 shows the seventh embodiment of the present invention.

In the diagram the same components as shown in FIG. 13 have the same reference numbers as shown in FIG. 13.

In the pulse width compensation circuit 130 of this embodiment the degradation in pulse width is compensated for without receiving a hold signal by generating a hold signal for terminating the detection using a hold signal generator circuit 131, when the digital signal output is counted by a counter circuit 132, from when a carrier detection signal is issued and the count exceeds a set number of counts, and canceling the carrier detection signal 17 or canceling the hold signal using a reset signal 18.

This embodiment comprises a counter circuit 132 for counting the number of bits of the smoothed burst data signal, which are outputted from a low-pass filter 13 and a hold signal generator circuit 131 for generating a hold signal. When first a reset signal is inputted from a transmission system of the burst data, the reset signal is transferred to a carrier detection signal generator circuit 16, the counter circuit 132, the hold signal generator circuit 131 and a pulse width compensation threshold generator circuit 14 to reset these circuits to receive the next burst data. When a burst data signal is inputted, the detection signal generator circuit 16 generates a carrier detection signal 17, and the burst data signal is transferred to the low-pass filter 13 from the digital signal amplitude regenerator circuit 10 through the switch 12. The burst data signal outputted from the low-pass filter 13 in which the waveform is smoothed is transferred to the counter circuit 132, and the number of bits of the header area is counted in order. The number counted by the counter circuit 132 is inputted to the hold signal generator circuit 131. In the hold signal generator circuit 131 a predetermined count number is stored, and when the number counted by the counter circuit 132 exceeds this predetermined count number, the hold signal generator circuit 131 generates a hold signal, and inputs the hold signal to the pulse width compensation generator circuit 14. When receiving the hold signal, the pulse width compensation generator circuit 14 stores the threshold, and compensates the degradation in pulse width of the data area following the header area as described above. The hold signal can be canceled when the reset signal is inputted or the system can be configured so that the carrier detection signal 17 may be inputted to the hold signal generator circuit 131 and the hold signal may be canceled when the carrier detection signal 17 is canceled.

The count number set in the hold signal generator circuit 131 estimates the number of bits of a header area needed for the pulse width compensation threshold generator circuit 14 to generate an appropriate threshold, and should be appropriately determined when the pulse width compensation circuit 130 is designed. In this case, the time needed for the pulse width compensation threshold generator circuit 14 to acquire an appropriate threshold, the number of bits of a header area, transmission speed, etc. shall be taken into consideration.

Figure 15A:
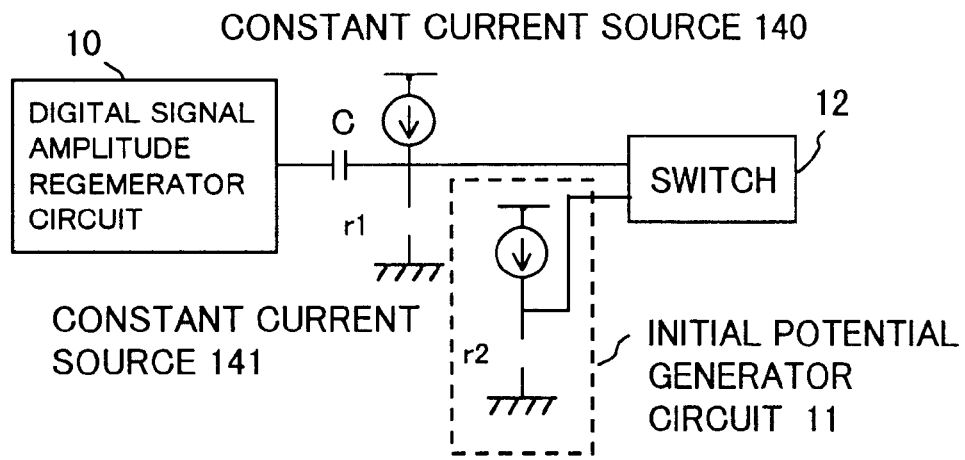
FIGS. 15A and 15B show an embodiment of an initial potential generator circuit.
Figure 15B:
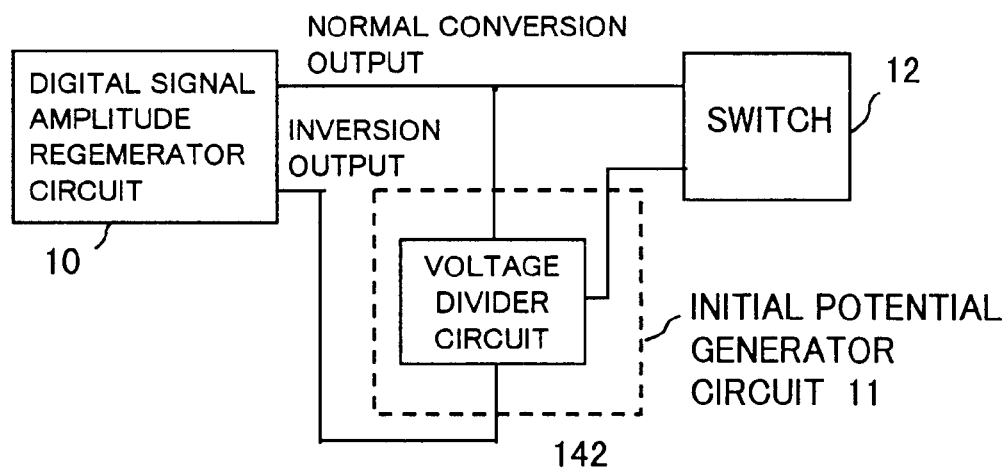

FIGS. 15A and 15B show an embodiment of an initial potential generator circuit.

In FIG. 15A an initial potential generator circuit 11 resistant to power voltage fluctuations can be obtained by providing a digital signal with a DC level at the output end of a digital signal amplitude regenerator circuit 10.

That is, the DC component is removed by providing the output end of the digital signal amplitude regenerator circuit 10 with a capacitor C. Then, a new DC component is provided using a constant-current source 140 and a resistor r1. By composing an initial potential generator circuit 11 using a constant-current source 141 and a resistor r2, and setting so that a DC voltage value generated by the constant-current source 140 and a resistor r1 may be equal to a DC voltage value generated by the constant-current source 141 and a resistor r2, the detected initial value of a threshold can be equal to the DC voltage component of a burst data signal when a switch 12 switches the digital signal amplitude regenerator circuit 10 to an initial potential generator circuit 11. Accordingly, the level of the DC voltage component of the burst data becomes equal to the initial level provided by the initial potential generator circuit 11 when the current of the constant voltage source 140 is generated from the same power voltage, even if an initial potential provided by the initial potential generator circuit 11 changes due to a fluctuation in the power voltage, etc., and thereby the setting process of the threshold can be started from an optimal initial value.

In FIG. 15B, an initial potential generator circuit 11 resistant to power voltage fluctuations can be obtained by causing the output of the initial potential generator circuit 11 to fluctuate in the same direction as a digital signal output, when the power voltage fluctuates.

That is, the system is configured so that when a burst data signal received by the digital amplitude regenerator circuit 10 is amplified and reproduced, a normal conversion output and an inversion output obtained by inverting this normal conversion output between the "1" level and "0" level of the digital output level may be generated, and both the outputs may be inputted to a voltage divider circuit 142 of the initial potential generator circuit 11. The voltage divider 142 divides the voltage values of the normal conversion output and inversion output, and provides an initial potential. According to this embodiment, since the initial potential is provided based on a transmitted burst data signal and the initial potential fluctuates in the same manner when the DC voltage value of the burst data signal fluctuates, the setting process of a threshold can also be executed from an optimal initial level. Although an amplitude-amplified noise is outputted by the digital signal amplitude regenerator circuit 10 when there is no burst data, the initial potential for a threshold setting process cannot be biased to a "1" level or "0" level, since the normal conversion output potential and the inversion output potential are divided are provided as an initial potential.

As described above, according to the present invention, pulse width degradation of a burst data signal can be compensated for after being amplified up to an original digital level.

What is claimed is:

1. A circuit for compensating for the degradation in pulse width of burst data having a header area with a predetermined mark-to-space ratio and a data area for storing data, comprising:

an initial potential generating unit providing an initial potential when starting to detect a threshold in order to compensate for the degradation in a pulse width;

a switch unit switching the initial potential to a burst data signal when the burst data signal is inputted;

a low-pass filter unit possessing a similar cut-off frequency to a signal transmission speed for smoothing the waveform of an output from the switch unit;

a limiting amplifier unit amplifying the output of said low-pass filter unit and inputting the output of said low-pass filter to a signal input terminal;

a threshold generating unit starting a threshold detection for compensating the degradation in pulse width by switching the switch unit when the burst data signal is inputted, terminating the threshold detection before the detection of the header area of the burst data is completed, and storing the threshold until the burst data signal is completed, wherein the output of the threshold generating unit is connected to a reference potential terminal of said limiting amplifier unit, and the degradation in pulse width of the burst data signal is compensated for with the initial potential inputted to the reference potential terminal as the threshold.

2. The circuit for compensating for the degradation in pulse width of burst data according to claim 1, wherein said threshold generating unit further comprises a peak detecting unit detecting a peak level of the burst data signal by restricting a detected volume per unit time;

a trough detecting unit detecting a trough level of the burst data signal by restricting the detected volume per unit time; and a voltage dividing unit generating the threshold from a peak detection potential and a trough detection potential, and the peak and trough detecting units storing the peak detection potential and the trough detection potential respectively as long as the detection of said data area continues.

3. The circuit for compensating for the degradation in pulse width of burst data according to claim 1, wherein the threshold is detected by a charge pump designed so that a current for charging and a current for discharging provides equivalent volume of current when a mean value of the burst data signal is equivalent to the initial potential.

4. The circuit for compensating for the degradation in pulse width of burst data according to claim 1, wherein the threshold is detected by detecting a mean value using resistance and capacitance.

5. The circuit for compensating for the degradation in pulse width of burst data according to claim 1, wherein a hold signal for instructing storing of said detected threshold in said threshold generating unit is generated in a pulse width compensation circuit using either or both of a carrier detection signal for indicating that a burst data signal is detected, and a reset signal generated in order to instruct resetting of the threshold when there is no burst data signal.

6. The circuit for compensating for the degradation in pulse width of burst data according to claim 2, further comprising a voltage comparing unit comparing the outputs of the peak and trough detection units, with a respective set reference potential, wherein by issuing a hold signal for instructing storing of said detected threshold in said threshold generating unit when either of the outputs exceeds a reference amplitude, and canceling the hold signal by canceling a carrier detection signal for indicating that the burst-data signal is detected or using a reset signal generated in order to instruct to reset the threshold when there is no burst signal, the function of the hold signal is implemented.

7. The circuit for compensating for the degradation in pulse width of burst data according to claim 2, further comprising a voltage comparing unit comparing the difference in output of the peak and trough detection units with a set reference potential, wherein by using a hold signal for instructing storing of said detected threshold in said threshold generating unit when the difference in output exceeds a reference amplitude, and canceling the hold signal by canceling a carrier detection signal for indicating that the burst data signal is detected or using a reset signal generated in order to instruct resetting of the threshold when there is no burst signal, the function of the hold signal is implemented.

8. The circuit for compensating for the degradation in pulse width of burst data according to claim 1, further comprising:

a delay unit delaying a carrier detection signal for indicating that the burst data signal is detected by a predetermined time, wherein by issuing a hold signal for instructing storing of said detected threshold in said threshold generating unit delaying the issuance of the carrier detection signal for the predetermined time by the delaying unit, and canceling the hold signal by canceling the carrier detection signal for indicating that the burst data signal is detected or using a reset signal generated in order to instruct to reset the threshold when there is no burst signal, the function of the hold signal is implemented.

9. The circuit for compensating for the degradation in pulse width of burst data according to claim 1, further comprising:

a counter unit counting a number of bits of the burst data signal in accordance with issuance of a carrier detection signal for indicating that the burst data signal is detected, wherein by issuing a hold signal for instructing storing of said detected threshold in said threshold generating unit after a predetermined number of bits, and canceling the hold signal by canceling the carrier detection signal for indicating that the burst data signal is detected or using a reset signal generated in order to instruct to reset the threshold when there is no burst signal, the function of the hold signal is implemented.

10. The circuit for compensating for the degradation in pulse width of burst data according to claim 1, further comprising:

a first clamp unit providing a resultant digital signal with a DC level, wherein the initial potential generating unit resistant to power voltage fluctuations is implemented by cutting off a DC component of the burst data signal by connecting a capacitor to the burst data signal in series, providing a new DC level to the burst data signal by said clamp unit, and composing said initial potential generating unit using a second clamp unit with the same characteristics of the first clamp unit.

11. The circuit for compensating for the degradation in pulse width of burst data according to claim 1, wherein the initial potential generating unit resistant to power voltage fluctuations is implemented by connecting a normal conversion output and an inversion output of a digital level signal of the burst data signal to a voltage dividing unit, and using the output of the voltage dividing unit as the output of the initial value generating unit.

12. A circuit for compensating for the degradation in pulse width of burst data, comprising:

a threshold generating unit detecting a threshold to compensate for the degradation in pulse width from a transmitted burst data signal;

a pulse width compensating unit reshaping the pulse width based on the threshold generated by the threshold generating unit; and an initial potential generating unit providing an initial potential when the threshold generating unit detects the threshold, wherein when the burst data is not detected, the initial potential is provided to the threshold generating unit and when the burst data is first detected, the reshaping of the pulse width is started based on the initial potential as the threshold.

13. The circuit for compensating for the degradation in pulse width of burst data according to claim 12, wherein said threshold generating unit issues a threshold by pursuing and detecting a peak value and a trough value of the signal level of the burst data signal, and dividing the obtained peak value and trough value.

14. The circuit for compensating for the degradation in pulse width of burst data according to claim 13, wherein when the pulse width of the burst data signal is not appropriate, said threshold generating unit holds the peak value and trough value before either peak detection or trough detection detects a real peak value or trough value.

15. The circuit for compensating for the degradation in pulse width of burst data according to claim 14, wherein said threshold is stored when said peak detection value or said trough detection value exceeds or falls below predetermined levels.

16. The circuit for compensating for the degradation in pulse width of burst data according to claim 14, wherein said threshold is stored when the difference in level between said peak detection value and said trough detection value exceeds or falls below predetermined values.

17. The circuit for compensating for the degradation in pulse width of burst data according to claim 12, wherein by generating a potential corresponding to the pulse width of a burst data signal at each end of a capacitor by applying a voltage corresponding to a voltage value of the received burst data signal to the capacitor, said threshold generating unit uses the potential as the threshold.

18. The circuit for compensating for the degradation in pulse width of burst data according to claim 12, wherein said threshold generating unit terminates the threshold detection a predetermined time after the detection of the burst data, and stores the threshold.

19. The circuit for compensating for the degradation in pulse width of burst data according to claim 12, wherein said threshold generating unit terminates the threshold detection after a predetermined number of bits from the bits of the burst data are detected, and stores the threshold.

20. The circuit for compensating for the degradation in pulse width of burst data according to claim 12, wherein said pulse width compensating unit comprises a unit providing the burst data, of which a DC potential is removed, with a new DC potential after the DC potential is removed from said burst data, and said initial potential generating unit provides the same DC potential as the new DC potential provided to the burst data as the initial potential.

21. The circuit for compensating for the degradation in pulse width of burst data according to claim 12, wherein said initial potential generating unit provides the potential obtained by potentially dividing a normal conversion signal and inversion signal of the burst data as the initial potential.

22. A method for compensating for the degradation in pulse width of burst data having a header area with a mark-to-space ratio of 1/2 and a data area for storing data, comprising:

providing an initial potential when detecting a threshold to compensate for the degradation in pulse width;

switching the initial potential to a burst data signal when the burst data signal is inputted;

removing the high frequency components in order to smooth the waveform of the burst data signal;

starting a threshold detection for compensating for the degradation in pulse width when the burst data signal is inputted, terminating the threshold detection before the detection of the header area of the burst data is completed, and storing the threshold until the detection of the burst data signal is completed; and reshaping the pulse width of the burst data signal of which the waveform is smoothed, based on the threshold.

* * * * *